United States Patent
Kessler et al.

(10) Patent No.: US 7,469,595 B2
(45) Date of Patent: Dec. 30, 2008

(54) PIEZOELECTRIC DAMAGE DETECTION DEVICE

(75) Inventors: Seth S. Kessler, Brookline, MA (US); Kristin A. Jugenheimer, Cambridge, MA (US); Aaron B. Size, Cambridge, MA (US); Christopher T. Dunn, Swampscott, MA (US)

(73) Assignee: Metis Design Corporation, Cambridge, MA (US)

( * ) Notice: Subject to any disclaimer, the term of this patent is extended or adjusted under 35 U.S.C. 154(b) by 0 days.

(21) Appl. No.: 11/071,856

(22) Filed: Mar. 3, 2005

(65) Prior Publication Data

US 2006/0081071 A1    Apr. 20, 2006

Related U.S. Application Data

(60) Provisional application No. 60/549,668, filed on Mar. 3, 2004, provisional application No. 60/616,704, filed on Oct. 7, 2004.

(51) Int. Cl.
*G01M 5/00* (2006.01)
*G01H 11/08* (2006.01)

(52) U.S. Cl. .............................. 73/802; 73/583; 73/587

(58) Field of Classification Search ........... 73/804–808, 73/583, 584, 586, 774–778, 801, 802, 587; 250/227
See application file for complete search history.

(56) References Cited

U.S. PATENT DOCUMENTS

| | | | |
|---|---|---|---|
| 2,247,246 A | 6/1941 | Lindsay et al. | |
| 3,453,626 A | 7/1969 | Wilson et al. | |
| 3,555,498 A | 1/1971 | Nye et al. | |
| 3,568,198 A | 3/1971 | Borowitz et al. | ............ 343/112 |
| 3,821,740 A | 6/1974 | Ehrlich | .................. 343/100 SA |
| 3,963,677 A * | 6/1976 | Enger | ......................... 523/113 |
| 3,986,182 A | 10/1976 | Hackett | .................. 340/258 A |
| 4,242,743 A | 12/1980 | Salem | ......................... 367/93 |
| 4,890,697 A | 1/1990 | Fischer et al. | .............. 188/1.11 |
| 4,910,464 A | 3/1990 | Trett et al. | ...................... 328/5 |
| 4,958,100 A * | 9/1990 | Crawley et al. | ............. 310/328 |
| 5,065,629 A | 11/1991 | Koike et al. | .................... 73/602 |
| 5,105,918 A * | 4/1992 | Hagiwara et al. | ........ 188/266.7 |
| 5,111,210 A | 5/1992 | Morse | ......................... 342/455 |
| 5,195,046 A | 3/1993 | Gerardi et al. | .............. 364/506 |

(Continued)

OTHER PUBLICATIONS

S.S. Kessler and C.T. Dunn. "Optimization of Lamb Wave Actuating and Sensing Materials for Health Monitoring of Composite Structures." Proceedings of the SPIE's 10th International Symposium on Smart Structures and Materials, Mar. 3-6, 2003, San Diego, CA. Accessed online at <http://web.mit.edu/sskess/www/papers/SPIE03.pdf> on Dec. 22, 2007.*

(Continued)

*Primary Examiner*—Edward Lefkowitz
*Assistant Examiner*—Punam Patel
(74) *Attorney, Agent, or Firm*—Mintz, Levin, Cohn, Ferris, Glovsky and Popeo, P.C.

(57) ABSTRACT

A device for use in detecting structural damage includes at least one piezoelectric wafer that has a sensor, and an actuator in-plane with the sensor. At least one of the sensor and the actuator at least partially surrounds the other of the sensor and the actuator such that the piezoelectric wafer provides radial detection of structural occurrences in a material.

32 Claims, 6 Drawing Sheets

U.S. PATENT DOCUMENTS

| | | | | |
|---|---|---|---|---|
| 5,305,507 | A | 4/1994 | Dvorsky et al. | 29/25.35 |
| 5,528,557 | A | 6/1996 | Horn | 367/129 |
| 5,739,626 | A * | 4/1998 | Kojima et al. | 310/360 |
| 5,774,376 | A | 6/1998 | Manning | 364/508 |
| 6,006,163 | A | 12/1999 | Lichtenwalner et al. | 702/36 |
| 6,370,964 | B1 | 4/2002 | Chang et al. | 73/862.046 |
| 6,400,307 | B2 | 6/2002 | Fullerton et al. | 342/28 |
| 6,475,639 | B2 | 11/2002 | Shahinpoor et al. | 428/614 |
| 6,617,764 | B2 * | 9/2003 | Sebastian et al. | 310/329 |
| 6,768,312 | B2 | 7/2004 | Sun et al. | 324/525 |
| 6,850,788 | B2 | 2/2005 | Al-Ali | 600/323 |
| 6,931,173 | B1 | 8/2005 | Wang et al. | 385/18 |
| 6,943,484 | B2 * | 9/2005 | Clark et al. | 310/334 |
| 6,964,201 | B2 * | 11/2005 | Xu et al. | 73/794 |
| 7,075,424 | B1 | 7/2006 | Sundaresan et al. | 340/500 |
| 2003/0009300 | A1 * | 1/2003 | Giurgiutiu | 702/35 |
| 2004/0012491 | A1 | 1/2004 | Kulesz et al. | 340/506 |
| 2004/0126305 | A1 | 7/2004 | Chen et al. | 423/447.5 |
| 2004/0151071 | A1 | 8/2004 | Kocher | 368/10 |
| 2004/0163478 | A1 * | 8/2004 | Xu et al. | 73/763 |
| 2005/0011277 | A1 * | 1/2005 | Gao et al. | 73/826 |
| 2005/0114045 | A1 | 5/2005 | Giurglutiu et al. | 702/35 |
| 2006/0031426 | A1 | 2/2006 | Mesarina et al. | 709/220 |
| 2007/0012111 | A1 * | 1/2007 | Kim | 73/594 |

OTHER PUBLICATIONS

Kessler S.S., Spearing S.M., and M.J. Atalla. "In-Situ Damage Detection of Composite Materials using Lamb Wave Methods." Presented to the European Workshop on Structural Health Monitoring, Jul. 10, 2002. Accessed online at <http://web.mit.edu/sskess/www/ppt/EWSHM02.pdf> on Dec. 22, 2007.*

Kessler et al., "In-Situ Damage Detection for Composites Structures using Lamb Wave Methods", pp. 1-9 (2002).*

Bar-Cohen, Y., "Emerging NDE Technologies and Challenges at the Beginning of the 3rd Millennium—Part I, Part II", http://www.ultrasonic.de/article/v05n01/barcohen/barcohen.htm, 13 pages, 1999.

Chang, F., "A Summary Report of the 2nd Workshop on Structural Health Monitoring", *Structural Health Monitoring*, Sep. 9-10, 1999.

Chaumette, D., "Certification Problems for Composite Airplane Structures", *Progress in Advanced Materials and Processes: Durability, Reliability and Quality Control* 19-28 (1985).

Crawley et al., "Use of Piezoelectric Actuators as Elements of Intelligent Structures", *AIAA J.*, 25(10):1373-1385 (1987).

Hall et al., "The Total Data Integrity Initiative (TDI$^2$)—Structural Health Monitoring, The Next Generation", (1999).

Huber et al., "The Selection of Mechanical Actuators Based on Performance Indices", *Proc. R. Soc. Lond.*, 453:2185-2205 (1997).

Kessler et al., "Damage Detection in Built-Up Composite Structures Using Lamb Wave Methods", Department of Aeronautics and Astronautics, MIT, 1-29, Jan. 2002.

Kessler et al., "Damage Detection in Composite Materials Using Frequency Response Methods", Department of Aeronautics and Astronautics, MIT, 1-19, (2002).

Kessler et al., "Damage Detection in Composite Materials Using Lamb Wave Methods", Department of Aeronautics and Astronautics, MIT, 1-24, Sep. 9-12, 2001.

Kessler et al., "Design of a Piezoelectric-Based Structural Health Monitoring System for Damage Detection in Composite Materials", Department of Aeronautics and Astronautics, MIT, 1-11, Mar. 2000.

Kessler et al., "Experimental Application of Optimized Lamb Wave Actuating/Sensing Patches for Health Monitoring of Composite Structures", 1-8, Sep. 15-17, 2003.

Kessler et al., "In-Situ Sensor-Based Damage Detection of Composite Materials for Structural Health Monitoring", *American Institute of Aeronautics and Astronautics*, 1-11(2002).

Kessler et al., "Optimization of Lamb Wave Methods for Damage Detection in Composite Materials", 1-11 (2001).

Kessler et al., "Packaging of Structural Health Monitoring Components", 1-11, 2004.

Kessler, S.S., "Piezoelectric-Based In-Situ Damage Detection of Composite Materials for Structural Health Monitoring Systems", 1-200, MIT, Ph.D thesis, Jan. 2002.

Kessler et al., "Selection of Materials and Sensors for Health Monitoring of Composite Structures", 1-10, 2003.

Kessler et al., "Structural Health Monitoring in Composite Materials Using Frequency Response Methods", 1-11, Jan. 2002.

Kessler et al., "Structural Health Monitoring in Composite Materials Using Lamb Wave Methods", 1-13 (2001).

Kessler et al, "Structural Health Monitoring of Composite Materials Using Piezoelectric Sensors", 1-24, 2002.

Khan et al., "Non-Destructive Testing Applications in Commercial Aircrafts Maintenance" http://www.ndt.net/article/ecndt98/aero/031/031.htm, 11 pages, 1999.

Lamb, H., "On Waves in an Elastic Plate", 114-128(1916).

Marantidis et al., "Acoustic-Emission Sensing in an On-Board Smart Structural Health Monitoring System for Military Aircraft", *SPIE*, 2191:258-264, 1994.

Neumair, M., "Requirements on Future Structural Health Monitoring Systems", 11-18, 1998.

Shieh et al., "The Selection of Sensors", *Progress in Materials Science*, 46:461-504 (2001).

Srikar et al., "Materials Selection in Micromechanical Design: An Application of the Ashby Approach", *J. of Microelectromechanical Systems*, 12(1):3-10 (2003).

Viktorov, I.A., "Rayleigh and Lamb Waves: Physical Theory and Applications", 1-154 (1967).

Zupan et al., "Actuator Classification and Selection—The Development of a Database", *Advanced Engineering Materials*, 4(12):933-940(2002).

* cited by examiner

PIEZOELECTRIC DAMAGE DETECTION DEVICE

RELATED APPLICATIONS

This application claims the benefit of priority to U.S. Provisional Application Ser. No. 60/549,668, filed on Mar. 3, 2004 and U.S. Provisional Application Ser. No. 60/616,704, filed on Oct. 7, 2004, each of which is herein incorporated by reference in its entirety.

FIELD OF THE INVENTION

The invention generally relates to the field of damage detection and structural health monitoring systems defused in aerospace, automotive, naval, civil or other applications.

BACKGROUND OF THE INVENTION

Known methods of laboratory non-destructive structural testing (NDT) methods, such as X-ray detection and C-scans, are impractical for service inspection of built-up structures due to the size and complexity of their infrastructure. Structural Health Monitoring (SHM) involves the incorporation of non-destructive test methods into a structure to provide continuous remote monitoring for damage. SHM systems are systems with the ability to detect and interpret adverse changes in a structure, such as an airplane or other aircraft, automobiles, and naval applications, for example. SHM systems that have been implemented in diverse industries generally include the adhesion of strain gauges or thermocouples to monitor changes in strain, frequency and temperature. Known forms of SHM are "black-boxes" on aircraft that collect critical flight data. Current SHM efforts have focused on sensing methods and sensor physics for damage detection, however, the sensor node needed to employ the methods has been largely unaddressed.

SUMMARY OF THE INVENTION

The invention relates to a damage detection sensor to provide packaged components to facilitate damage detection using a variety of sensors and sensing methods. Embodiments of the invention provide a device for use in detecting structural damage. The device includes at least one piezoelectric wafer, the wafer including a sensor, and an actuator in-plane with the sensor, wherein at least one of the sensor and the actuator at least partially surrounds the other of the sensor and the actuator such that the piezoelectric wafer provides radial detection of structural occurrences.

Implementations of the invention may include one or more of the following features. The device may include a flexible circuit configured to provide power to the at least one piezoelectric wafer. The flexible circuit can be configured to provide a communication connection to the sensor to collect data from the sensor. The flexible circuit can be configured to provide shielding for the sensor and for the actuator. The device can include a housing constructed and arranged to encapsulate the sensor and actuator. The housing may include an outer cylindrical ring and a lid. The sensor and the actuator can be positioned in the cylindrical ring. The device can further include coaxial connectors constructed and arranged to provide a strain relief for the sensor and the actuator. The coaxial connectors can include miniature coaxial connectors that provide connection between the at least one piezoelectric wafer and at least one electronic component in the housing.

Implementations of the invention may further include one or more of the following features. The sensor can be at least one of a geometry including triangular, circular, semi-circular, square, rectangular, octagonal, hexagonal, and pie-shaped. The actuator can be at least one of a geometry including triangular, circular, semi-circular, square, rectangular, octagonal, hexagonal, and pie-shaped. The actuator can substantially completely surround the sensor. The sensor can substantially completely surround the actuator. The device can include a plurality of sensors co-located on the at least one piezoelectric wafer, wherein the plurality of sensors are collectively at least partially surrounded by the actuator. The device can include a plurality of actuators co-located on the at least one piezoelectric wafer, wherein the plurality of actuators are collectively at least partially surrounded by the sensor. The at least one piezoelectric wafer may provide substantially a 360-degree radial detection of structural occurrences in a material.

Other embodiments of the invention provide a damage detection node for detecting structural damage. The node includes a housing, a flexible circuit positioned in the housing, a piezoelectric wafer positioned in the housing and having a sensor and an actuator, at least one of the sensor and the actuator positioned to at least partially surround the other of the sensor and the actuator. The flexible circuit provides a communication connection to the piezoelectric wafer.

The invention provides one or more of the following capabilities. The damage detection device can be mass-produced at a low cost, and customized for any application in software. The device can be broadly defused in aerospace, automotive, naval and civil applications, or any field in which a single sensor or a distributed network of sensors is required to collect data. The device can be integrated into ageing structures or integrated into newly designed structures. The invention can enable the elimination of scheduled inspections. Structural design can be improved with increased reliability and reduced life-cycle costs. Embodiments of the invention can be constructed without the use of solder and exposed wires. Fewer sensors can accomplish detection without limiting the range over which detecting is desired. Embodiments of the invention can be implemented as a continuously monitoring system, which can require less human intervention. Other capabilities will be apparent upon a review of the Figures and Detailed Description that follows.

DETAILED DESCRIPTION OF THE INVENTION

The features and other details of the invention will now be more particularly described. It will be understood that particular embodiments described herein are shown by way of illustration and not as limitations of the invention. The principal features of this invention can be employed in various embodiments without departing from the scope of the invention.

Embodiments of the invention are directed to concentrically positioned sensors and actuators. Embodiments of the invention can be directed to a piezoelectric-based sensor and actuator for use in facilitating damage detection, non-destructive testing ("NDT") and structural health monitoring ("SHM") using a variety of sensors and sensing methods. Embodiments of the invention can include damage detection systems employing one or more than one piezoelectric damage detector. Embodiments of the invention relate to a collection of electrical and mechanical components necessary to conduct in-situ damage detection methods. Embodiments of the invention can be implemented as wired systems or as wireless systems. Embodiments of the invention can be used in SHM of aircraft, spacecraft, naval vessels and automobiles. Embodiments of the invention may be used in other structures using sensor networks and to conduct testing procedures other than NDT and SHM procedures. For example, embodiments of the invention can be used for non-destructive evaluation, data measurement, usage monitoring (HUMS), security, surveillance or quality control. Embodiments of the invention can be used for other applications.

Figure 1:
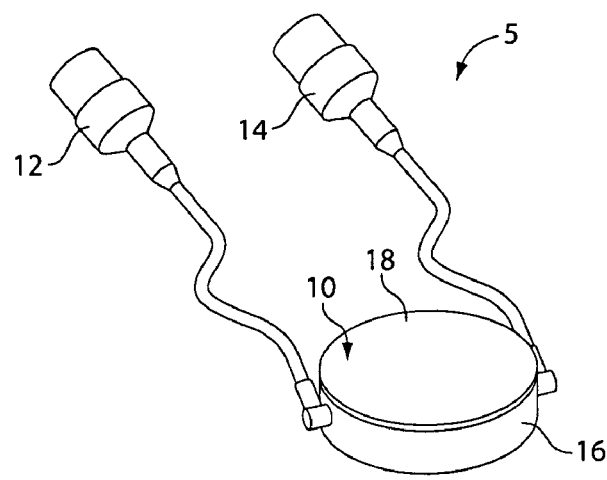
FIG. 1 is a perspective view of a damage detection device.

Referring to FIG. 1, a sensor node 5, or patch, includes a housing 10, a connector 12 and a connector 14. The housing includes a cylinder body 16 and a top lid 18. The cylinder 16 and the top lid 18 seal to form an encapsulation, or housing 10. The housing 10 encapsulates electronic components of the sensor node 5. As used herein, the node 5 refers to a single sensor unit.

Figure 2:
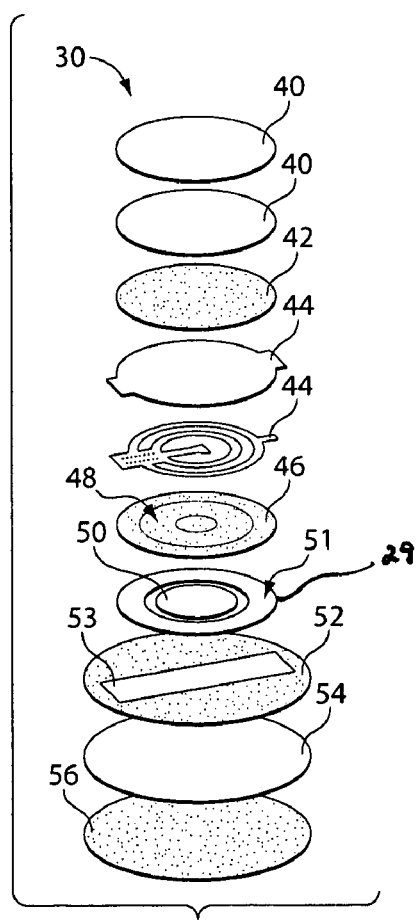
FIG. 2 is an assembly drawing of the piezoelectric stack contained in the casing of a damage detection device.

In an expanded view, in FIG. 2, the piezoelectric stack 30 contained in the housing 10 includes a copper-coated Kapton™ shield 40, an adhesive film 42, a copper-coated Kapton™ electrode 44, an electrically conductive adhesive 46, a second film adhesive layer 48, the piezoelectric sensor 50 and actuator 51, a third film adhesive layer 52 having an electrically conductive portion 53, a polyester film layer 54 and a fourth film adhesive layer 56. For purposes of the following, the sensor 50/actuator 51 pair may be referred to as a piezoelectric wafer 29. The copper-coated Kapton™ shield 40 is a layer of copper-coated Kapton™ that provides an insulating surface on the topside and an electromagnetic interference (EMI) shield on the underside. The adhesive film 42 can be an insulator capable of bonding to copper-coated Kapton™. For example, the adhesive film 42 can be 3M™ 3132 film adhesive. The flexible circuit electrode 44 is a layer of copper-coated Kapton™. The electrode pattern can be created using Ferric Chloride. The copper-coated Kapton™ electrode 44 provides contacts to both the sensor 50 and the actuator 51. The copper-coated Kapton™ electrode 44 can also provide a shielding ground loop between the sensor 50 and the actuator 51. The ground loop can prevent in-plane parasitic noise. The electrically conductive adhesive 46 and the second film adhesive layer 48 connect the leads to the piezoelectric sensor 50 and actuator 51. The adhesive 46 and the second film adhesive layer 48 can be provided to avoid a short circuit. The third film adhesive layer 52 provides an electrically conductive layer of adhesive and is positioned beneath the sensor 50/actuator 51 layer to provide a common ground. The film layer 54 and the fourth film adhesive layer 56 provide a semi-rigid backing for mounting to a structure that the sensor node 5 is monitoring.

The copper-coated Kapton™ electrode 44 provides ground and signal traces from the sensor 50, to be connected to a printed circuit board via the micro-connectors 12 and 14, such as MMCX connectors, for example, to provide an interface for assembly. The copper-coated Kapton™ electrode 44 also provides in- and out-of-plane shielding for the analog sensor signal by creating a copper Faraday cage surrounding the trace.

The sensor 50/actuator 51 is controlled by the flexible circuit electrode 44. Adhesive layers between the electrode 44 and the sensor 50/actuator 51 connect each layer of the piezoelectric stack 30. Adhesive layers can be electrically conductive. Alternatively, adhesive layers can connect other layers without electrical conductivity. The piezoelectric sensor 50 measures reflected waves in a material on which the sensor is positioned. Sensors can record, for example, phenomenon such as strain, acceleration, sound waves, electrical or magnetic impedance, pressure or temperature. The piezoelectric actuator 51 excites waveforms in a material to create reflected waves that the sensor 50 measures.

Figure 3:
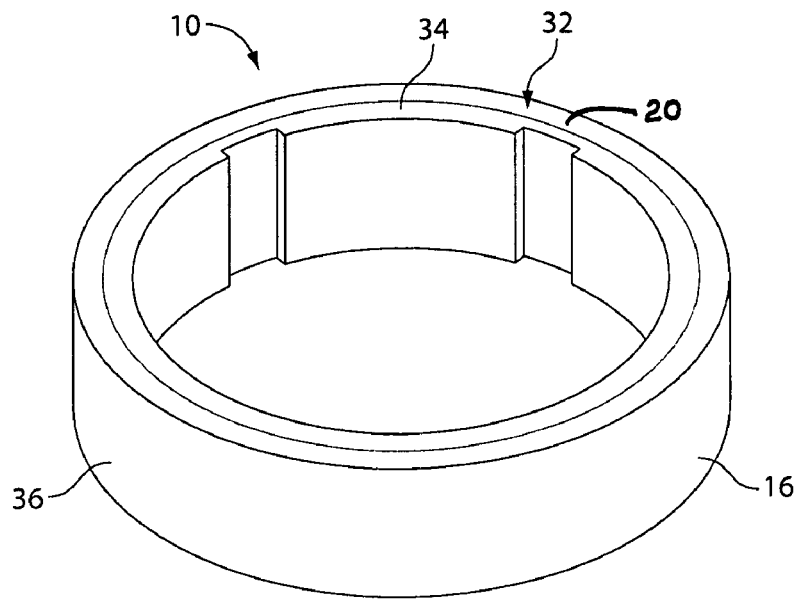
FIG. 3 is a top perspective view of the internal portion of an assembled damage detection device.
Figure 4:
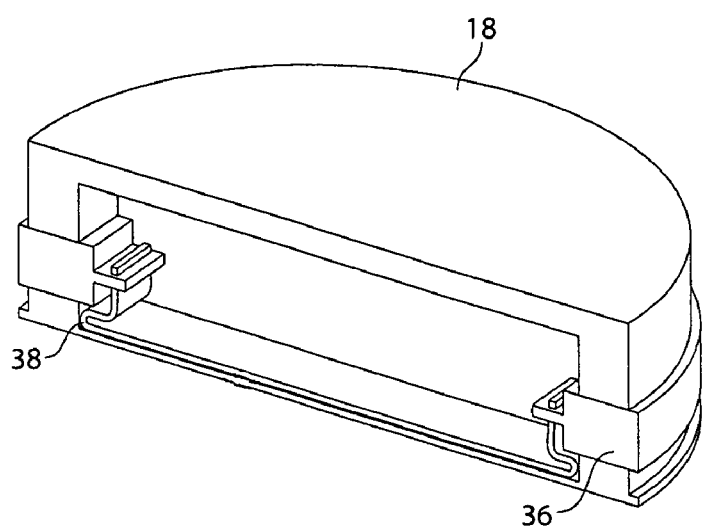
FIG. 4 is a cross sectional view of the internal portion of an assembled damage detection device.

The housing 10 provides an interface between the sensor 50 and the structure to which the node 5 is connected for monitoring. When assembled, the node 5 is capable of providing an integrated sensing unit for conveying information about a structure. Referring to FIGS. 3 and 4, the sensor node including the piezoelectric wafer 29 is assembled in the housing 10. The housing 10 is comprised of the cylinder 16 and the top lid 18. The cylinder 16 includes the inner o-ring 20 and an o-ring groove 32, a grounding ring 34, MMCX connector apertures 36 and flex brackets 38. The apertures 36 are positioned to accept micro-connectors, such as connector 12 and connector 14. For example, the connectors can be MMCX connectors that provide strain relief and co-axial connections for power and data collection. The MMCX connector apertures 36 accept MMCX connectors that complete mating connection with the internal portion of the housing 10 and extend to an external portion of the node 5. The apertures 36 can be positioned on opposite sides of the cylinder 16. The o-ring groove 32 is positioned on a top face of the cylinder 16 and accommodates an o-ring 20. The o-ring 20 provides a seal that is preferably watertight to keep moisture from entering the housing 10.

A top portion of the cylinder 16 can be threaded on an internal face of the cylinder 16, for example. The top lid 18 can be a flat portion having a threaded rim to engage with the threads of the cylinder 16. Alternatively, the top lid 18 and the cylinder 16 can be fitted in a number of known means of closure. The lid 18 can be alternatively designed to complete the housing 10 including glue-on press fits, screw top, and cam-lock, preferably incorporating o-rings to provide a seal.

The housing 10 provides a barrier for the electronic components of the node 5. The housing 10 can include a low moisture absorbing plastic casing. For example, a low density, low moisture absorbing and moldable plastic such as an Acetal (e.g. Delrin) can be used as a casing material. The housing 10 provides an enclosure to package each component of the infrastructure of the node 5, protecting the components against incidental impact damage, sealing the components from moisture, and isolating the sensor 50 from large induced strains on the structure or cables. The housing 10 can provide additional protections or barriers for node 5. Nominal dimensions for this housing 10 can be, for example, approximately 1.5" in diameter and 0.3" in height with a 0.1" wall thickness, however depending on the nature of the application, the housing 10 can be smaller or larger in any dimension. Preferably, the housing 10 of the detection device has an outer diameter of approximately 1.6 inches and a total volume less than 1 cubic inch. The height of the housing can be approximately 0.5 inches.

The housing 10 is survivable to a large variety of common solvents, including fuels, oils, paint, acetone and cleaning solutions, as well as other chemicals. The housing 10 can operate under thermal conditions between −50° F. and 250° F. The housing 10 may be designed to operate under thermal conditions below −50° F. or above 250° F. The housing 10 containing the node 5 can be adhered to a structure using a thermoset or thermoplastic film adhesive, or by using a traditional epoxy. Other adhesives are possible. The housing 10 is further preferably constructed to withstand a strain of 2000 microstrain and can have a vibration resonance tolerance of 66 Hz or greater.

Figure 5A:
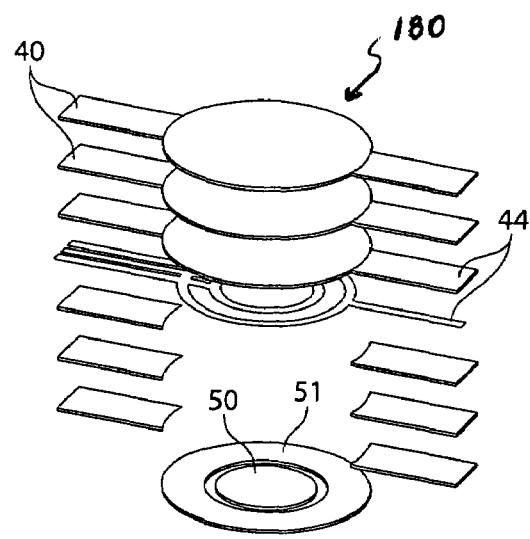
FIG. 5A is a portion of the piezoelectric stack of FIG. 2.
Figure 5B:
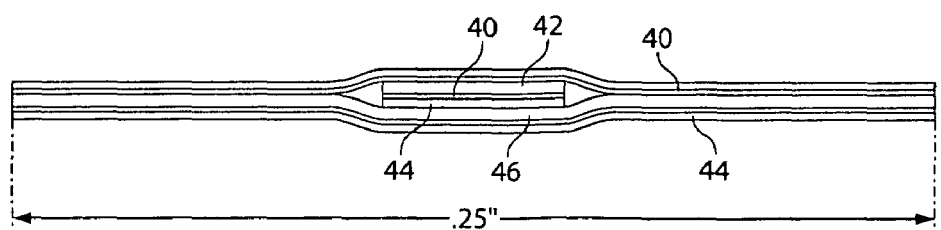
FIG. 5B is a side perspective view of a portion of the piezoelectric stack of FIG. 2.

FIG. 5A is an exploded assembly view showing each of the layers of the flexible circuit surrounding the piezoelectric elements. Included are conducting layer on top with a shield layer above that, and a bottom grounding layer. Also displayed are the layered wings that carry the power and sensor signal with shields on either side. FIG. 5B is a collapsed assembled version of FIG. 5A.

The electrode flexible circuit 180, shown in FIG. 5A, controls the sensor 50 and actuator 51. The electrode flexible circuit is positioned above the sensor 50/actuator 51 layer. Each of the layers of the flexible circuit is connected by the contact of the side tabs, shown in FIG. 5B. The flexible circuit 180 provides electrical connections. A copper-coated Kapton™ element is printed so that there are separate grounds for the actuator and sensor, and separate ground traces to provide in and out-of-plane signal shielding. Wings on the side of the flexible circuit 180 fold up. The wings can provide an electrical connection in a substantially convenient location during manufacture and integration. The wings are shielded in and out-of-plane. The wings terminate in heat bonded or soldered MMCX connectors. The connectors provide a rigid support for the electronic connections, and have a flange to provide a strain relief to the sensing node 5. The copper casing provides a Faraday cage for the sensor signal contain therein. External to the device, standard co-axial cables and the complementary MMCX adaptors are used to connect the device to electronic equipment to provide actuator excitation and data acquisition.

Figure 6A:
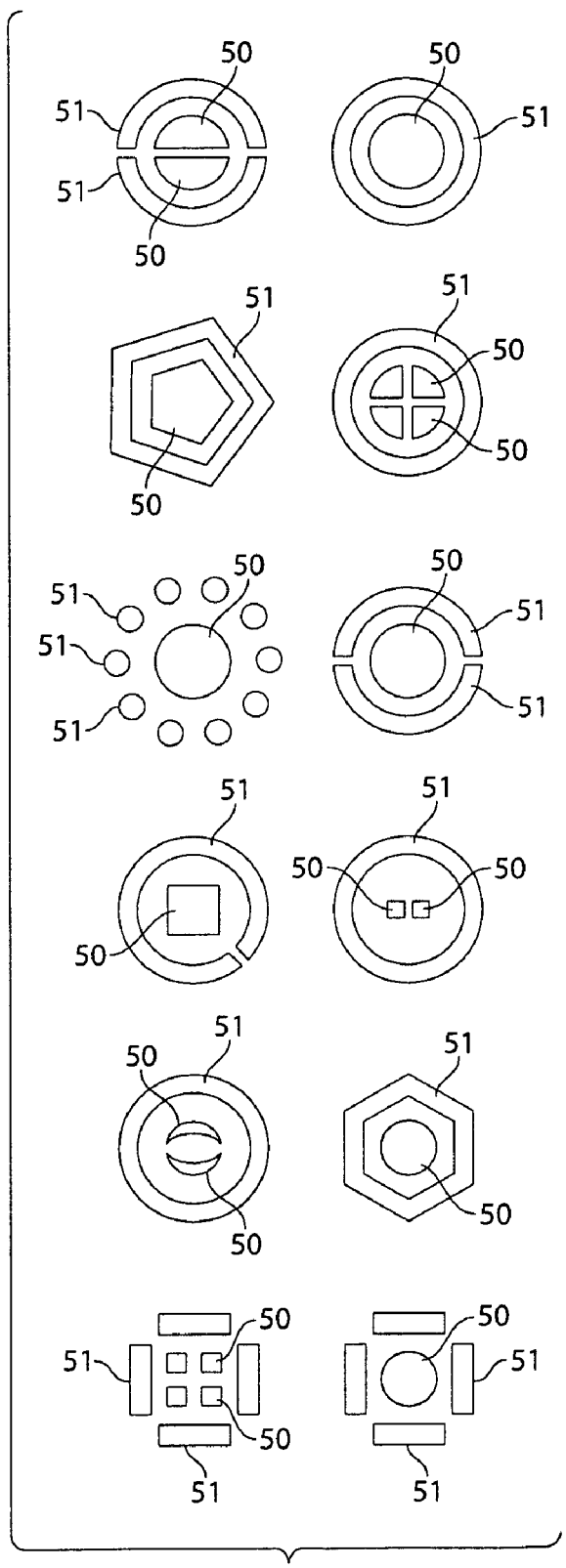
FIG. 6A includes alternative geometries for a sensor substantially surrounded by an actuator.

The sensor 50/actuator 51 layer of the node 5 comprises a concentric, circular sensor 50 having an outer ring comprising the actuator 51. The sensor 50 and the actuator 51 are in-plane components capable of connection to the circuit without the use of wires. Referring to FIG. 6A, the in-plane sensor 50 and actuator 51 can be a number of alternative shapes. For example, the sensor 50 can be circular, semicircular, square, triangular, rectangular, pie-shaped, hexagonal, octagonal, and any of a number of other shapes. The actuator 51 can also be any of a number of shapes configured to substantially surround the sensor 50. The substantially concentric design of the sensor 50 and actuator 51 provide omnidirectional operation of the node 5. The substantially concentric design of the sensor 50 and actuator 51 provide a pulse/echo method of sensing. By having an actuator that surrounds a sensor or set of sensors (or vice versa) this allows excited signals (electrical, magnetic, acoustic, vibrational or otherwise) to be emanated omni-directionally from a nearly point source, and for response measurements to be taken from nearly that same location.

Figure 6B:
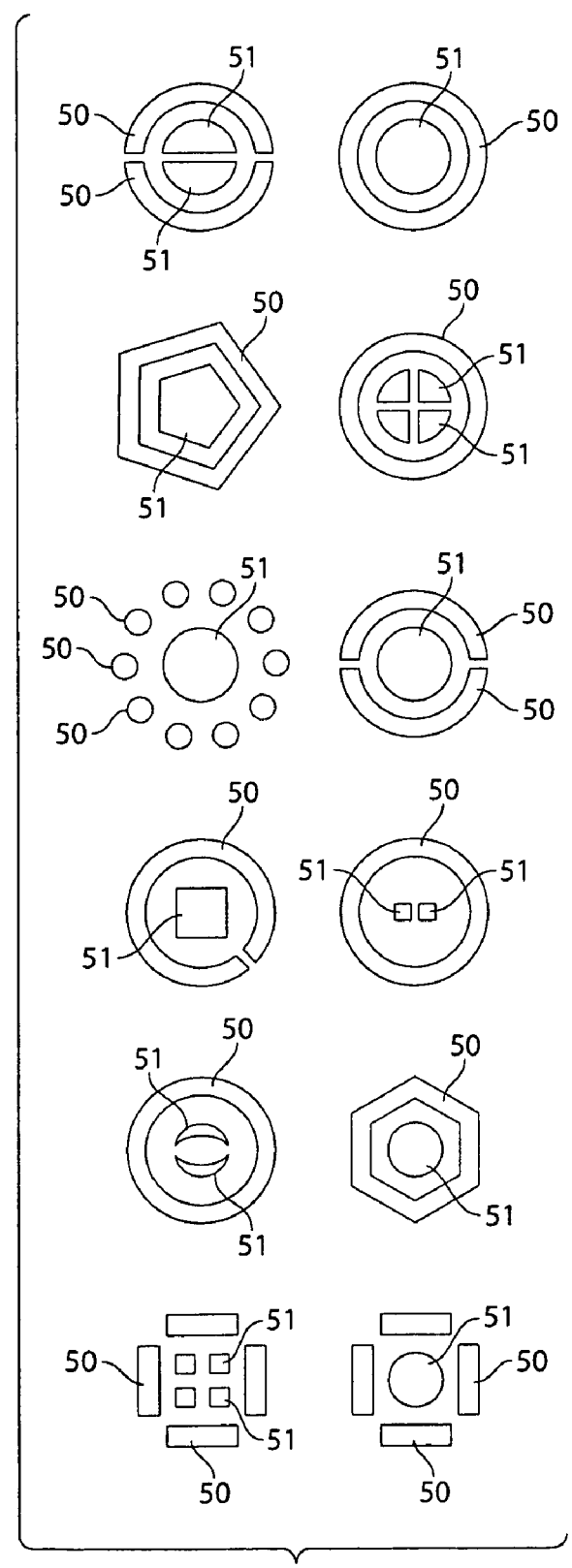
FIG. 6B includes alternative geometries for an actuator substantially surrounded by a sensor.

Each of the sensor 50 and the actuator 51 can surround, or substantially surround the other. In each of the alternative configurations shown in FIG. 6B, the center portion can be the actuator 51, surrounded by one or more than one sensor 50. Thus, a sensor or a set of sensors can be surrounded by an actuator or a set of actuators. Alternatively, an actuator or a set of actuators can be surrounded by a sensor or a set of sensors in the concentric design. In some systems, at least one of the piezoelectric nodes includes a sensor 50 surrounded by an actuator 51, and at least one of the piezoelectric nodes includes an actuator 51 surrounded by a sensor 50 where each of the nodes works in tandem with the other or others to accomplish material sensing.

The in-plane configuration of the actuator 51/sensor 50 pair achieves contact with a material to be monitored or tested using thermoset or thermoplastic tape, epoxy, using a couplant material, or with an externally applied force. Other room temperature or elevated cure methods of contact are possible and envisioned. In some applications, the sensor 50 and actuator 51 pair are not encapsulated in a housing 10, but are substantially directly positioned on a material or structure for use. The actuator 51/sensor 50 pair can be actuated with an electrical or magnetic field being applied so as to excite through-thickness, axial, shear or radial modes in the actuator. This field can be applied to a parallel face of the actuator 51, or using interdigitated electrode patterns. Sensor voltage data can be measured using any of these fields. Preferably, the sensor 50 and actuator 51 are constructed of a piezo-ceramic material. Other known materials can be used, however, such as other piezoelectric materials (PVDF, PMA, etc), piezoresistive materials or magnetorestrictive materials, for example.

The particular piezoelectric material used for the wafer 29 can be PZT-5A in order to reduce the dependency of performance on temperature, however other grades of PZT such as PZT-5H would also be acceptable. The piezoelectric elements are either injection molded, machined or micro-fabricated in either addition or subtraction processes into the desired geometry, typically less than 1" in diameter. Other dimensions are possible and envisioned, and may vary depending on optimizing an application.

Damage detection methods use the actuator 51/sensor 50 pair to determine the presence of damage in a structure. Damage detection methods may also be used to determine the size, shape, type, location and extent of damage in a structure or material, as well as the criticality of maintenance, repair or replacement. For example, methods include lamb waves, modal analysis, acoustic emission, strain/stress monitoring, temperature and acceleration measurement. Each of the damage detection methods can use a single actuator 51/sensor 50 pair measuring at different frequencies and time samples. Methods of detection can be accomplished by changing frequency of actuation, frequency of acquisition and filters. Further, the use of passive methods (such as strain and/or acoustic emission) to trigger active methods (such as frequency response and lamb waves) can be used to conserve power. Active modes can be used at set intervals or upon user command tests. Methods of detection can include intermittent active methods, which can seek detailed information. Passive methods can be listening for events that can trigger active methods of detection.

Figure 7:
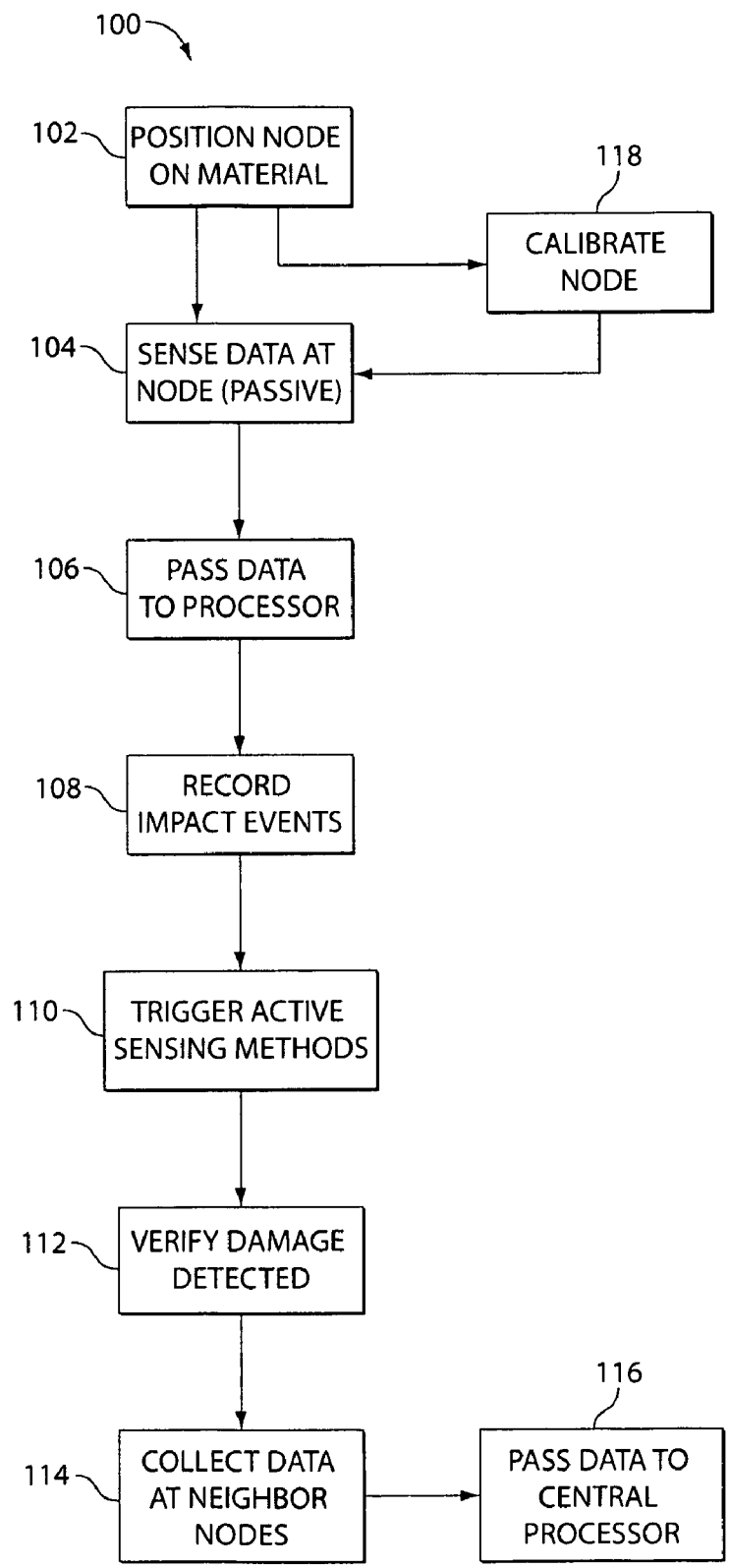
FIG. 7 is a flow chart of a process of using a damage detection device.

In operation, referring to FIG. 7, with further reference to FIGS. 1-6, a process 100 for detecting damage in a material or structure using a node 5 includes the stages shown. The process 100, however, is exemplary only and not limiting. The process 100 may be altered, e.g., by having stages added, removed, or rearranged.

At stage 102, a node 5 is positioned on the surface of a material or a structure for which structural integrity is to be tested or monitored. The node 5 can alternatively be embedded in a material or structure to conduct detection. Although the system can operate continuously, the system can be accessed by individuals to perform inspections on demand.

At stage 104, the node 5 collects data related to the structure to which it is affixed. The node 5 can collect data passively, for example, using strain and acoustic emission methods. Passive damage detection methods can be used continuously to sense the presence of damage in the structure. Passive methods are generally those that operate by detecting responses due to perturbations of ambient conditions. Strain monitoring is used to record strains over design limits, and can also be used to trigger more sophisticated detection methods. By analyzing the data at smaller time scales, acoustic emission can be performed passively to detect and record impact events and approximate the energy of impact. The nodes 5 pass the collected information to a local processing unit at stage 106.

Abnormal strain and/or acoustic events are recorded, as shown at stage 108. Conditions that differ from the ambient conditions of a structure can be recorded and further analyzed. To determine damage, comparison is made with baseline measurement.

Where abnormal events have been detected, an active sensing method is triggered at the node 5, stage 110. When abnormal data is encountered, active methods such as frequency response and Lamb wave techniques are initiated. Active methods are used to give more information about the type, severity and location of damage. Active methods, for example, use an externally supplied energy in the form of a stress or electromagnetic wave to function. Examples of active methods include, but are not limited to, electrical and magnetic impedance measurements, eddy currents, optical fibers that use a laser light source, modal analysis and Lamb wave propagation. Active methods can be triggered by an event detected by the passive methods. Alternatively or concurrently, active methods can be performed at pre-set time intervals or initiated by an operator.

At stage 112, data from the active sensing mode is collected to verify damage. In a system that employs more than one node 5 for detection, once a single node 5 has collected damage, data is collected by nearby nodes in order to help confirm the presence and severity of damage, stage 114. At stage 116, the data is passed from node 5 to node 5, and to a central processing unit to be interpreted. For example, all of the data can be passed from each node 5. The damage type, severity, and location can be communicated to other individuals, as can suggested actions.

In some methods of the invention, fixed spacing between the actuator 51 in a first node 5 and the sensor 50 in a second node 5 can be used to calculate wave speed in a material at the material's present state. The wave speed calculation self-calibrates the system and may reduce the need for analytically derived wave speed calculations to be determined. The calibration process 118 can take place prior to each test measurement. Based on the calibration process 118, the system is self-compensating for the effects of temperature, humidity, strain or creep. For example, the fixed distance between the actuator and the sensor divided by the time of flight of the wave between the actuator and the sensor determines wave speed. The wave can be, for example, a surface, shear, Raleigh, Lamb or other type of wave for use in calculating wave speed. Self-compensation can be used to determine the state of the structure, e.g., thermal, hygral or strain. Also, by measuring the impedance and other signature data such as total energy and frequency spectrum of the actuator while being excited, a self-diagnostic can be performed to detect irregular operation.

Active Damage detection methods can be performed by using either a single damage detection node 5, or a network of several devices 5 working independently or in collaboration. When using a single node 5, a pulse-echo type of operation is used, where the structure being monitored or tested is excited by an actuator, and a response or reflections are measured by a co-located sensor. In the case of using multiple nodes 5, damage detection can also be performed by pulse-echo, whereas each node 5 independently collects response or reflection data, which is fused together to map out damage locations. Alternatively, when using more than one node 5, a pitch-catch method can also be used, whereas an actuator from one node 5 excites the structures being monitored or tested, and sensors from one or more other device nodes 5 measure the transmitted response to determine the state of the structure. The device 5 at which the actuation occurs is referred to as the master node. When using the pitch-catch method, the master node designation is iteratively cycled through each of the various nodes 5 so that combinations of transfer functions can be collected. The preferred method is to employ both of the pulse-echo and pitch-catch methods simultaneously. This case is similar to the previously described pitch-catch only method, however in this case reflected data from the master node sensor is also collected to be fused with all of the other data.

In embodiments of the invention, methods can be facilitated in a number of ways. Tests can be initiated by using a dedicated arbitrary signal generation device such as an Agilent 33220 A, a rack mounted source such as offered by National Instruments, or a custom built source. These sources serve to excite the actuator in the node 5, and can also be used to trigger data collection. Data collection can be performed by using a variety of dedicated or virtual oscilloscope devices that log voltage measurements. Examples are the Tektronic 3024, several PXI rack mounted devices offered by National Instruments, or a custom built datalogger. Excitation and data collection can be initiated manually, remotely using a serial, GPIB, LAN or USB connection, or automated using custom software. The preferred method of testing is automated using integrated hardware control and analysis software such as LabVIEW or MATLAB. A designated arbitrary function generator unit can be commanded to excite an actuator, trigger a designated oscilloscope to collect data, analyze the data with a variety of programmed logic, and display graphical results to a user.

Once voltage data has been collected by one of the methods previously described, there are a variety of ways this data can be decomposed in order to ascertain the state of the structure. First data can be filtered and de-noised using bandpass filters in order to remove high frequency electrical noise and low frequency drift and mechanical vibrations. Algorithms can be used that compare the integrated energy levels received at the sensors to determine if damage is present; increased reflected energy and decreased transmitted energy are both metrics of damage. This is followed by an evaluation of reflection time of flight, in order to determine the damage location by multiplying these results by the wave velocity. A fast-Fourier-transform can be performed to inspect the resulting frequency bandwidth. The frequency bandwidth is used to determine the type of damage present in the structure. By using three separate sensor physics to evaluate the damage, for example, one can minimize the occurrence of false positives.

Those skilled in the art will recognize, or be able to ascertain using no more than routine experimentation, numerous equivalents to the specific procedures described herein. Such equivalents are considered to be within the scope of the invention. Various substitutions, alterations, and modifications may be made to the invention without departing from the spirit and scope of the invention. Other aspects, advantages, and modifications are within the scope of the invention. The contents of all references, issued patents, and published patent applications cited throughout this application are hereby incorporated by reference. The appropriate components, processes, and methods of those patents, applications and other documents may be selected for the invention and embodiments thereof.

The invention claimed is:

1. A device for use in detecting structural damage, the device comprising:
   an encapsulation configured to attach to a structure and containing at least one piezoelectric wafer including:
   a single sensor configured to detect structural damage in the structure; and
   a single actuator co-located with the sensor in the encapsulation,
   wherein at least one of the single sensor and the single actuator is substantially arcuate and at least partially surrounds the other of the single sensor or the single actuator such that the single actuator and single sensor are substantially concentric and the encapsulation provides radial detection of structural occurrences from a single point location.

2. The device of claim 1 further comprising a circuit configured to provide power to the encapsulation.

3. The device of claim 2 wherein the circuit is further configured to provide a communication connection to the sensor to collect data from the sensor.

4. The device of claim 1 wherein the encapsulation is a housing constructed and arranged to encapsulate the sensor and actuator.

5. The device of claim 1 wherein the sensor is at least one of a geometry including triangular, circular, semi-circular, square, rectangular, octagonal, hexagonal, and pie-shaped.

6. The device of claim 1 wherein the actuator is at least one of a geometry including triangular, semi-circular, square, rectangular, octagonal, hexagonal, and pie-shaped.

7. The device of claim 1 wherein the actuator substantially completely surrounds the sensor.

8. The device of claim 1 wherein the sensor substantially completely surrounds the actuator.

9. The device of claim 1 further comprising a plurality of sensors co-located on the at least one piezoelectric wafer, wherein the plurality of sensors are collectively at least partially surrounded by the actuator.

10. The device of claim 1 further comprising a plurality of actuators co-located on the at least one piezoelectric wafer, wherein the plurality of actuators are collectively at least partially surrounded by the sensor.

11. The device of claim 1 wherein the at least one piezoelectric wafer provides substantially a 360-degree radial detection of structural occurrences in a material.

12. The device of claim 1 further comprising a plurality of sensors co-located on the at least one piezoelectric wafer, wherein the plurality of sensors collectively at least partially surround the actuator.

13. The device of claim 1 further comprising a plurality of actuators co-located on the at least one piezoelectric wafer, wherein the plurality of actuators collectively at least partially surround the sensor.

14. The device of claim 1 further comprising a plurality of actuators and a plurality of sensors co-located on the at least one piezoelectric wafer, wherein the plurality of sensors are collectively at least partially surrounded by a plurality of actuators.

15. The device of claim 1 further comprising a plurality of actuators and a plurality of sensors co-located on the at least one piezoelectric wafer, wherein the plurality of actuators are collectively at least partially surrounded by a plurality of sensors.

16. A damage detection device for detecting structural damage in a structure, the device comprising:
   an encapsulation having a rigid casing and being configured to couple to a surface of the structure;
   a circuit positioned in the encapsulation;
   a piezoelectric wafer positioned in the encapsulation and having a sensor and an actuator, at least one of the sensor and the actuator being arcuate in shape and positioned to at least partially surround the other of the sensor and the actuator,
   wherein the sensor and the actuator are substantially concentric,
   wherein the sensor is configured to measure elastic waves in a material on which the encapsulation is coupled, and
   wherein the circuit provides a power connection to the piezoelectric wafer.

17. A device for use in detecting an occurrence in a material, the material having a surface, the device comprising:
   a piezoelectric actuator configured to be coupled to the surface of the material, and
   a piezoelectric sensor configured to be coupled to the surface of the material, and being co-located in-plane with the piezoelectric actuator when coupled to the surface,
   wherein the piezoelectric actuator at least partially surrounds the piezoelectric sensor and the piezoelectric sensor is configured to detect structural damage in the material,
   wherein the sensor is configured to measure elastic waves in a material on which the piezoelectric sensor is coupled, and
   wherein the piezoelectric actuator and the piezoelectric sensor are substantially concentric.

18. The device of claim 17 wherein the piezoelectric sensor is at least one of a triangular, semi-circular, ring, square, rectangular, octagonal, hexagonal, and pie-shaped sensor.

19. The device of claim 17 wherein the piezoelectric sensor and the piezoelectric actuator are positioned within an encapsulating case.

20. The device of claim 17 where in the sensor provides substantially a 360-degree radial detection of structural occurrence in the material.

21. The device of claim 17 wherein the piezoelectric actuator is at least one of a triangular, semi-circular, ring, square, rectangular, octagonal, hexagonal, and pie-shaped actuator.

22. The device of claim 17 wherein the piezoelectric sensor comprises a plurality of sensors that are collectively at least partially surrounded by the piezoelectric actuator.

23. The device of claim 17 wherein the piezoelectric actuator comprises a plurality of actuators that collectively at least partially surround the piezoelectric sensor.

24. The device of claim 17 wherein the piezoelectric actuator comprises a plurality of actuators that collectively at least partially surround the piezoelectric sensor, wherein the piezoelectric sensor comprises a plurality of sensors.

25. A device for use in detecting an occurrence in a material, the material having a surface, the device comprising:
   a piezoelectric sensor configured to couple to the surface of the material, wherein the piezoelectric sensor is also configured to detect damage in the material, and
   a piezoelectric actuator configured to be coupled to the surface of the material, and being co-located in-plane with the piezoelectric sensor when coupled to the surface wherein the piezoelectric sensor at least partially surrounds the piezoelectric actuator, wherein the piezoelectric sensor is configured to measure elastic waves in a material on which the sensor is coupled, and wherein the piezoelectric sensor and the piezoelectric actuator are substantially concentric.

26. The device of claim 25 wherein the piezoelectric actuator is at least one of triangular, semi-circular, ring shaped, square, rectangular, octagonal, hexagonal, and pie-shaped actuator.

27. The device of claim 25 wherein the piezoelectric sensor and the piezoelectric actuator are positioned within an encapsulating case.

28. The device of claim 25 where in the sensor provides substantially a 360-degree radial detection of structural occurrence in a material.

29. The device of claim 25 wherein the piezoelectric sensor is at least one of triangular, semi-circular, ring shaped, square, rectangular, octagonal, hexagonal, and pie-shaped sensor.

30. The device of claim 24 wherein the piezoelectric actuator comprises a plurality of actuators that are collectively at least partially surrounded by the piezoelectric sensor.

31. The device of claim 25 wherein the piezoelectric sensor comprises a plurality of sensors that collectively at least partially surround the piezoelectric actuator.

32. The device of claim 25 where in the piezoelectric sensor comprises a plurality of sensors that collectively at least partially surround the piezoelectric actuator, wherein the piezoelectric actuator comprises a plurality of actuators.

\* \* \* \* \*

UNITED STATES PATENT AND TRADEMARK OFFICE
CERTIFICATE OF CORRECTION

PATENT NO.        : 7,469,595 B2
APPLICATION NO. : 11/071856
DATED             : December 30, 2008
INVENTOR(S)       : Seth S. Kessler et al.

It is certified that error appears in the above-identified patent and that said Letters Patent is hereby corrected as shown below:

Col. 9, line 33, please delete the word "circular".

Col. 12, line 4, please change "Claim 24" to --Claim 25--.

Signed and Sealed this

Twenty-fourth Day of February, 2009

JOHN DOLL
*Acting Director of the United States Patent and Trademark Office*